United States Patent
Anderson et al.

(10) Patent No.: US 8,492,866 B1
(45) Date of Patent: Jul. 23, 2013

(54) ISOLATED ZENER DIODE

(75) Inventors: Frederick G. Anderson, South Burlington, VT (US); Natalie B. Feilchenfeld, Jericho, VT (US); David L. Harmon, Essex, VT (US); Richard A. Phelps, Colchester, VT (US); Yun Shi, South Burlington, VT (US); Michael J. Zierak, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/345,881

(22) Filed: Jan. 9, 2012

(51) Int. Cl.
| | |
|---|---|
| H01L 29/861 | (2006.01) |
| H01L 31/107 | (2006.01) |
| H01L 29/30 | (2006.01) |
| H01L 29/866 | (2006.01) |
| H01L 29/34 | (2006.01) |
| H01L 29/74 | (2006.01) |
| H01L 31/111 | (2006.01) |
| H01L 29/73 | (2006.01) |
| H01L 29/739 | (2006.01) |
| H01L 31/0328 | (2006.01) |
| H01L 31/0336 | (2006.01) |
| H01L 31/072 | (2012.01) |
| H01L 31/109 | (2006.01) |
| H01L 29/00 | (2006.01) |
| H01L 29/864 | (2006.01) |

(52) U.S. Cl.
USPC ........... 257/481; 257/106; 257/108; 257/175; 257/199; 257/396; 257/397; 257/409; 257/482; 257/551; 257/603; 257/604; 257/605; 257/606; 257/E21.354; 257/E21.355; 257/E21.356; 257/E21.357; 257/E29.334; 257/E29.335; 257/E31.063

(58) Field of Classification Search
USPC ................. 257/106, 175, 199, 481–482, 551, 257/603–606, E21.354, E21.355, E21.356, 257/E21.357, E29.334, E29.335, E31.063, 257/108, 396, 397, 409
See application file for complete search history.

(56) References Cited

U.S. PATENT DOCUMENTS

| | | | |
|---|---|---|---|
| 4,173,022 A | 10/1979 | Dingwall | |
| 5,547,880 A | 8/1996 | Williams et al. | |

(Continued)

FOREIGN PATENT DOCUMENTS

| | | |
|---|---|---|
| JP | 11068085 | 3/1999 |
| JP | 2003163350 | 6/2003 |

OTHER PUBLICATIONS

Ker et al., "Interference of ESD Protection Diodes on RF Performance in Giga-Hz RF Circuits," IEEE, 2003, pp. 297-300.

Primary Examiner — Ida M Soward
(74) Attorney, Agent, or Firm — Gibb & Riley, LLC; Anthony J. Canale

(57) ABSTRACT

Disclosed is a Zener diode having a scalable reverse-bias breakdown voltage ($V_b$) as a function of the position of a cathode contact region relative to the interface between adjacent cathode and anode well regions. Specifically, cathode and anode contact regions are positioned adjacent to corresponding cathode and anode well regions and are further separated by an isolation region. However, while the anode contact region is contained entirely within the anode well region, one end of the cathode contact region extends laterally into the anode well region. The length of this end can be predetermined in order to selectively adjust the $V_b$ of the diode (e.g., increasing the length reduces $V_b$ of the diode and vice versa). Also disclosed are an integrated circuit, incorporating multiple instances of the diode with different reverse-bias breakdown voltages, a method of forming the diode and a design structure for the diode.

23 Claims, 14 Drawing Sheets

U.S. PATENT DOCUMENTS

| | | | |
|---|---|---|---|
| 5,602,404 A * | 2/1997 | Chen et al. | 257/112 |
| 5,751,042 A * | 5/1998 | Yu | 257/360 |
| 5,856,214 A * | 1/1999 | Yu | 438/133 |
| 5,882,967 A | 3/1999 | Brown et al. | |
| 5,939,767 A | 8/1999 | Brown et al. | |
| 5,998,837 A | 12/1999 | Williams | |
| 6,153,918 A * | 11/2000 | Kawashima et al. | 257/510 |
| 6,281,558 B1 * | 8/2001 | Sayama et al. | 257/391 |
| 6,320,260 B1 * | 11/2001 | Kohyama et al. | 257/754 |
| 6,552,399 B2 | 4/2003 | Jun et al. | |
| 6,734,054 B2 * | 5/2004 | Tang et al. | 438/197 |
| 6,919,604 B2 * | 7/2005 | Lai et al. | 257/362 |
| 6,940,104 B2 * | 9/2005 | Yeh et al. | 257/104 |
| 7,235,842 B2 | 6/2007 | Hueting et al. | |
| 7,420,250 B2 | 9/2008 | Lee et al. | |
| 7,420,255 B2 * | 9/2008 | Shimizu | 257/409 |
| 7,692,221 B2 | 4/2010 | Ozeki et al. | |
| 7,719,026 B2 * | 5/2010 | Lou et al. | 257/173 |
| 7,800,180 B2 * | 9/2010 | Watanabe et al. | 257/360 |
| 7,834,378 B2 * | 11/2010 | Ryu et al. | 257/173 |
| 7,868,382 B2 * | 1/2011 | Ronsisvalle et al. | 257/335 |
| 7,880,240 B2 * | 2/2011 | Takasu | 257/409 |
| 7,888,767 B2 * | 2/2011 | Huang et al. | 257/487 |
| 7,902,604 B2 | 3/2011 | Su et al. | |
| 8,084,833 B2 * | 12/2011 | Kato | 257/396 |
| 8,120,079 B2 * | 2/2012 | Augusto | 257/292 |
| 8,188,563 B2 * | 5/2012 | Finkelstein et al. | 257/481 |
| 8,198,651 B2 * | 6/2012 | Langguth et al. | 257/170 |
| 8,217,421 B2 * | 7/2012 | Chen et al. | 257/173 |
| 8,264,039 B2 * | 9/2012 | Wang et al. | 257/339 |
| 8,278,710 B2 * | 10/2012 | Khemka et al. | 257/339 |
| 2001/0015467 A1 * | 8/2001 | Huh et al. | 257/409 |
| 2006/0289947 A1 * | 12/2006 | Yamanaka | 257/409 |

* cited by examiner

ISOLATED ZENER DIODE

BACKGROUND

1. Field of the Invention

The disclosed embodiments relate to Zener diodes and, more particularly, to an isolated Zener diode structure having a scalable reverse-bias breakdown voltage ($V_b$), to an integrated circuit incorporating multiple instances of the Zener diode, at least two of which have different reverse-bias breakdown voltages, to a method of forming the Zener diode and to a design structure for the Zener diode.

2. Description of the Related Art

Zener diodes, like conventional diodes, allow current to flow in a forward direction. However, Zener diodes exhibit a reverse-bias breakdown voltage ($V_b$) that is low relative that of conventional diodes. Specifically, in the case of a conventional diode, current typically does not flow, when the diode is reverse-biased (i.e., when the voltage on the N-type cathode region of the diode is greater than the voltage on the P-type anode region). However, a large breakdown current will flow, when the diode is reverse-biased and the voltage on the N-type cathode region exceeds the reverse-bias breakdown voltage ($V_b$). In the case of a Zener diode, the reverse-bias breakdown voltage ($V_b$) is relatively low. As a result, Zener diodes can be used to protect other circuits against overvoltage conditions. For example, Zener diodes can be used as voltage regulators or as electrostatic discharge (ESD) protection circuits.

Unfortunately, in order to achieve such a relatively low reverse-bias breakdown voltage ($V_b$), additional masking and doping processes are required to either form the P-type anode region or N-type cathode region of the Zener diode or to add an additional amount of dopant to an already formed P-type anode region or N-type cathode region of the Zener diode. These additional masking and doping processes can be costly and time consuming. Thus, there is a need in the art for a Zener diode structure and method of forming the structure that allows a desired, relatively low, reverse-bias breakdown voltage ($V_b$) to be achieved without requiring additional masking and doping processes.

SUMMARY

In view of the foregoing, disclosed herein are embodiments of an isolated Zener diode structure having a scalable reverse-bias breakdown voltage ($V_b$) as a function of the position of a cathode contact region relative to the interface between adjacent cathode and anode well regions. Specifically, cathode and anode contact regions are positioned adjacent to corresponding cathode and anode well regions and are further separated by an isolation region. While the anode contact region is contained entirely within the anode well region, one end of the cathode contact region can extend laterally into the anode well region. The length of this end (i.e., the length of the portion of the cathode contact region that extends from the cathode well region to anode well region interface to the isolation region) can be selectively adjusted in order to selectively adjust the reverse-bias breakdown voltage ($V_b$) of the Zener diode. Specifically, increasing this length reduces the reverse-bias breakdown voltage ($V_b$) of the Zener diode and vice versa. Also disclosed herein are embodiments of an integrated circuit incorporating multiple instances of the Zener diode, having different reverse-bias breakdown voltages, of a method of forming the Zener diode and of a design structure for the Zener diode.

More particularly, disclosed herein are embodiments of a Zener diode. This Zener diode can comprise a semiconductor layer, a first well region in the semiconductor layer and a second well region in the semiconductor layer positioned laterally adjacent to and abutting the first well region at an interface. The first well region can have a first type conductivity and the second well region can have a second type conductivity different from the first type conductivity.

This Zener diode can further comprise a first contact region and a second contact region. The first contact region can have the first type conductivity at a relatively higher conductivity level than the first well region, can be positioned at the top surface of the semiconductor layer and can be contained entirely within the first well region. The second contact region can have the second type conductivity at a relatively higher conductivity level than the second well region, can be positioned at the top surface of the semiconductor layer and can further traverse the first well region to second well region interface such that a first end of the second contact region extends laterally into the first well region and a second end of the second contact region extends laterally into the second well region.

The Zener diode can further comprise an isolation region at the top surface of the semiconductor layer, contained entirely within the first well region, and positioned laterally between and abutting the first contact region and the first end of the second contact region. The first end of the second contact region (i.e., the portion of the second contact region that extends from the first well region to second well region interface to the isolation region) can have a predetermined length so that the Zener diode has a predetermined reverse-bias breakdown voltage ($V_b$).

Optionally, the Zener diode can further comprise a conductive field plate on the top surface of the semiconductor layer to further ensure that the Zener diode has the desired reverse-bias breakdown voltage ($V_b$). The conductive field plate can have a first sidewall aligned above the isolation region and a second sidewall opposite the first sidewall aligned above the first end of the second contact region. That is, the conductive field plate should not extend laterally over the first contact region or the second well region.

Also disclosed herein are embodiments of an integrated circuit incorporating multiple instances of the above-described Zener diode, wherein at least some of the Zener diodes have different reverse-bias breakdown voltages. Specifically, the integrated circuit can comprise a semiconductor layer and a plurality of diodes in the semiconductor layer. Each Zener diode can comprise a semiconductor layer, a first well region in the semiconductor layer and a second well region in the semiconductor layer positioned laterally adjacent to and abutting the first well region at an interface. The first well region can have a first type conductivity and the second well region can have a second type conductivity different from the first type conductivity.

Each Zener diode can further comprise a first contact region and a second contact region. The first contact region can have the first type conductivity at a relatively higher conductivity level than the first well region, can be positioned at the top surface of the semiconductor layer and can be contained entirely within the first well region. The second contact region can have the second type conductivity at a relatively higher conductivity level than the second well region, can be positioned at the top surface of the semiconductor layer and can further traverse the first well region to second well region interface such that a first end of the second contact region extends laterally into the first well region and a second end of the second contact region extends laterally into the second well region.

Each Zener diode can further comprise an isolation region at the top surface of the semiconductor layer, contained entirely within the first well region, and positioned laterally between and abutting the first contact region and the first end of the second contact region. The first end of the second contact region (i.e., the portion of the second contact region that extends from the first well region to second well region interface to the isolation region) can have a predetermined length so that the diode has a predetermined reverse-bias breakdown voltage ($V_b$). In this case, the first end of the second contact region of at least two of the Zener diodes can have different predetermined lengths such that at least two of the Zener diodes have different reverse-bias breakdown voltages. For example, the first end of the second contact region of a first Zener diode can have a first length and the first end of the second contact region of a second Zener diode can have a second length that is less than the first length such that the first reverse-bias breakdown voltage ($V_b$) of the first Zener diode is less than the second reverse-bias breakdown voltage ($V_b$) of the second Zener diode.

Optionally, any one or more of the Zener diodes can further comprise a conductive field plate on the top surface of the semiconductor layer to further ensure that the Zener diode has the desired reverse-bias breakdown voltage ($V_b$). The conductive field plate can have a first sidewall aligned above the isolation region and a second sidewall opposite the first sidewall aligned above the first end of the second contact region. That is, the conductive plate should not extend laterally over the first contact region or the second well region.

Also disclosed herein are embodiments of a method of forming a Zener diode, such as the Zener diode described above. The method can comprise forming adjacent well regions in a semiconductor layer such that the adjacent well regions comprise: a first well region, having a first type conductivity; and a second well region, having a second type conductivity different from the first type conductivity, positioned laterally adjacent to and abutting the first well region at an interface. The method can further comprise forming contact regions and at least one isolation region at the top surface of the semiconductor layer such that a first contact region, having the first type conductivity, is positioned within the first well region; such that a second contact region, having the second type conductivity, traverses the first well region to second well region interface and, thereby has a first end extending laterally into the first well region and a second end extending laterally into the second well region; and such that an isolation region is positioned within the first well region between and abutting both the first contact region and the first end of the second contact region. In forming these contact regions and the isolation region(s), the length of the first end of the second contact region (i.e., the length of the portion of the second contact region extending from the first well region to second well region interface to the isolation region) can be selectively adjusted in order to selectively adjust the reverse-bias breakdown voltage ($V_b$) of the Zener diode (i.e., in order to achieve a predetermined reverse-bias breakdown voltage ($V_b$)).

Optionally, the method can further comprise forming a conductive field plate on the top surface of the semiconductor layer in order to further reduce the reverse-bias breakdown voltage ($V_b$) of the Zener diode and ensure that the desired reverse-bias breakdown voltage ($V_b$) is achieved. In this case, the conductive field plate should be formed so that a first sidewall is aligned above the isolation region and a second sidewall opposite the first sidewall is aligned above the first end of the second contact region (i.e., so that the conductive field plate does not extend laterally over the first contact region or the second well region).

Also disclosed herein are embodiments of design structures for the above-mentioned Zener diode and integrated circuit. Such design structures can be stored on a non-transitory storage medium, which is readable by a computer, and can comprise data and instructions that when executed by the computer can generate a machine-executable representation of the Zener diode or integrated circuit.

BRIEF DESCRIPTION OF THE SEVERAL VIEWS OF THE DRAWINGS

The embodiments herein will be better understood from the following detailed description with reference to the drawings, which are not necessarily drawn to scale and in which.

DETAILED DESCRIPTION

Figure 1:
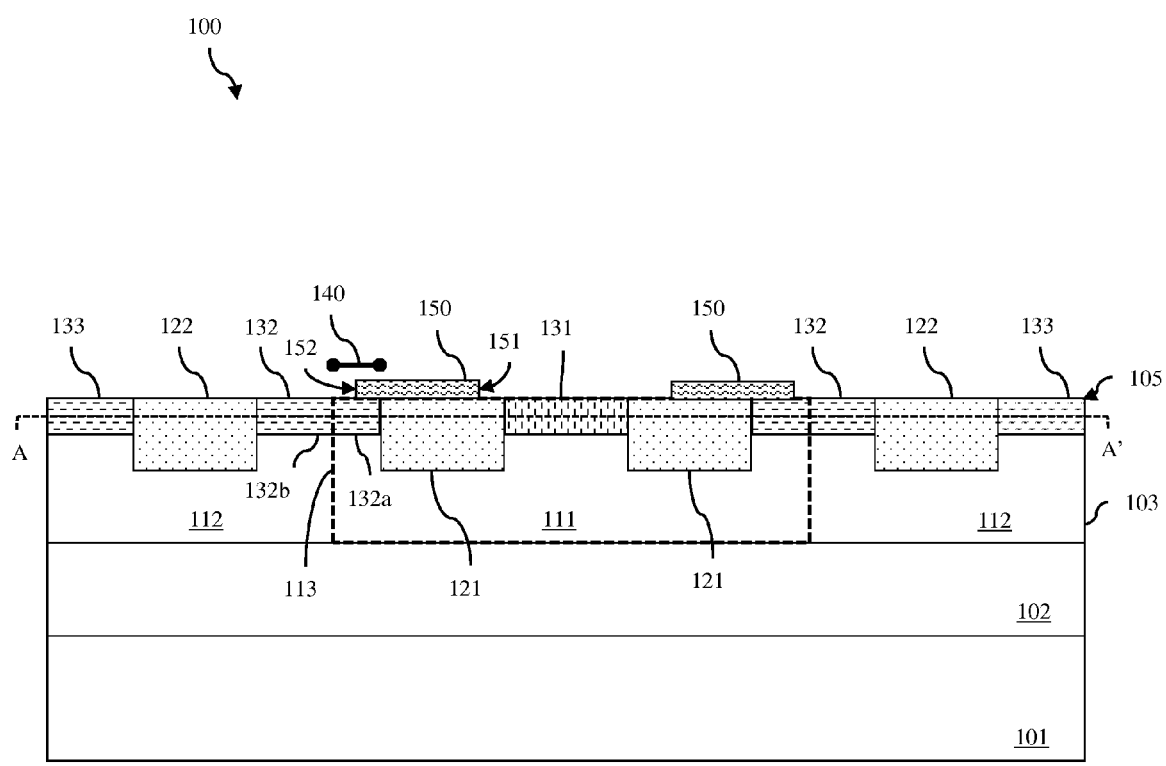
FIG. 1 is a cross-section diagram illustrating an embodiment of a Zener diode.

The descriptions of the various embodiments disclosed herein have been presented for purposes of illustration and are not intended to be exhaustive or limiting. Many modifications and variations will be apparent to those of ordinary skill in the art without departing from the scope and spirit of the disclosed embodiments. Furthermore, it should be noted that the terminology used herein was chosen to best explain the principles of the disclosed embodiments, the practical application of the disclosed embodiments or the technical improvements over technologies found in the marketplace, or to enable others of ordinary skill in the art to understand the disclosed embodiments.

As mentioned above, Zener diodes, like conventional diodes, allow current to flow in a forward direction. However, Zener diodes exhibit a reverse-bias breakdown voltage ($V_b$) that is low relative that of conventional diodes. Specifically, in the case of a conventional diode, current typically does not flow, when the diode is reverse-biased (i.e., when the voltage on the N-type cathode region of the diode is greater than the voltage on the P-type anode region). However, a large breakdown current will flow, when the diode is reverse-biased and the voltage on the N-type cathode region exceeds the reverse-bias breakdown voltage ($V_b$). In the case of a Zener diode, the reverse-bias breakdown voltage ($V_b$) is relatively low. As a result, Zener diodes can be used to protect other circuits against over-voltage conditions. For example, Zener diodes can be used as voltage regulators or as electrostatic discharge (ESD) protection circuits.

Unfortunately, in order to achieve such a relatively low reverse-bias breakdown voltage ($V_b$), additional masking and doping processes are required to either form the P-type anode region or N-type cathode region of the Zener diode or to add an additional amount of dopant to an already formed P-type anode region or N-type cathode region of the Zener diode. These additional masking and doping processes can be costly and time consuming. Thus, there is a need in the art for a Zener diode structure and method of forming the structure that allows a desired, relatively low, reverse-bias breakdown voltage ($V_b$) to be achieved without requiring additional masking and doping processes.

In view of the foregoing, disclosed herein are embodiments of an isolated Zener diode structure having a scalable reverse-bias breakdown voltage ($V_b$) as a function of the position of a cathode contact region relative to the interface between adjacent cathode and anode well regions. Specifically, cathode and anode contact regions are positioned adjacent to corresponding cathode and anode well regions and are further separated by an isolation region. While the anode contact region is contained entirely within the anode well region, one end of the cathode contact region can extend laterally into the anode well region. The length of this end (i.e., the length of the portion of the cathode contact region that extends from the cathode well region to anode well region interface to the isolation region) can be selectively adjusted in order to selectively adjust the reverse-bias breakdown voltage ($V_b$) of the Zener diode. Specifically, increasing the length reduces the reverse-bias breakdown voltage ($V_b$) of the Zener diode and vice versa. Also disclosed herein are embodiments of an integrated circuit incorporating multiple instances of the Zener diode, having different reverse-bias breakdown voltages, of a method of forming the Zener diode and of a design structure for the Zener diode.

It should be noted that in this Zener diode, as described in detail below, the first type conductivity can comprise P-type conductivity and the second type conductivity can comprise N-type conductivity. However, alternatively, the first type conductivity can comprise P-type conductivity and the second type conductivity can comprise N-type conductivity. Those skilled in the art will recognize that the different dopants can be used to achieve different type conductivities in different semiconductor materials. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (MG), whereas a gallium nitride (GaN)-based semiconductor material having an N-type conductivity is typically doped with silicon (Si). Additionally, those skilled in the art will further recognize that different conductivity levels will depend upon the relative concentration levels of the dopants. For example, a higher P-type conductivity level in one P-type component can be achieved using a higher relative dopant concentration as compared to another P-type component.

Figure 2:
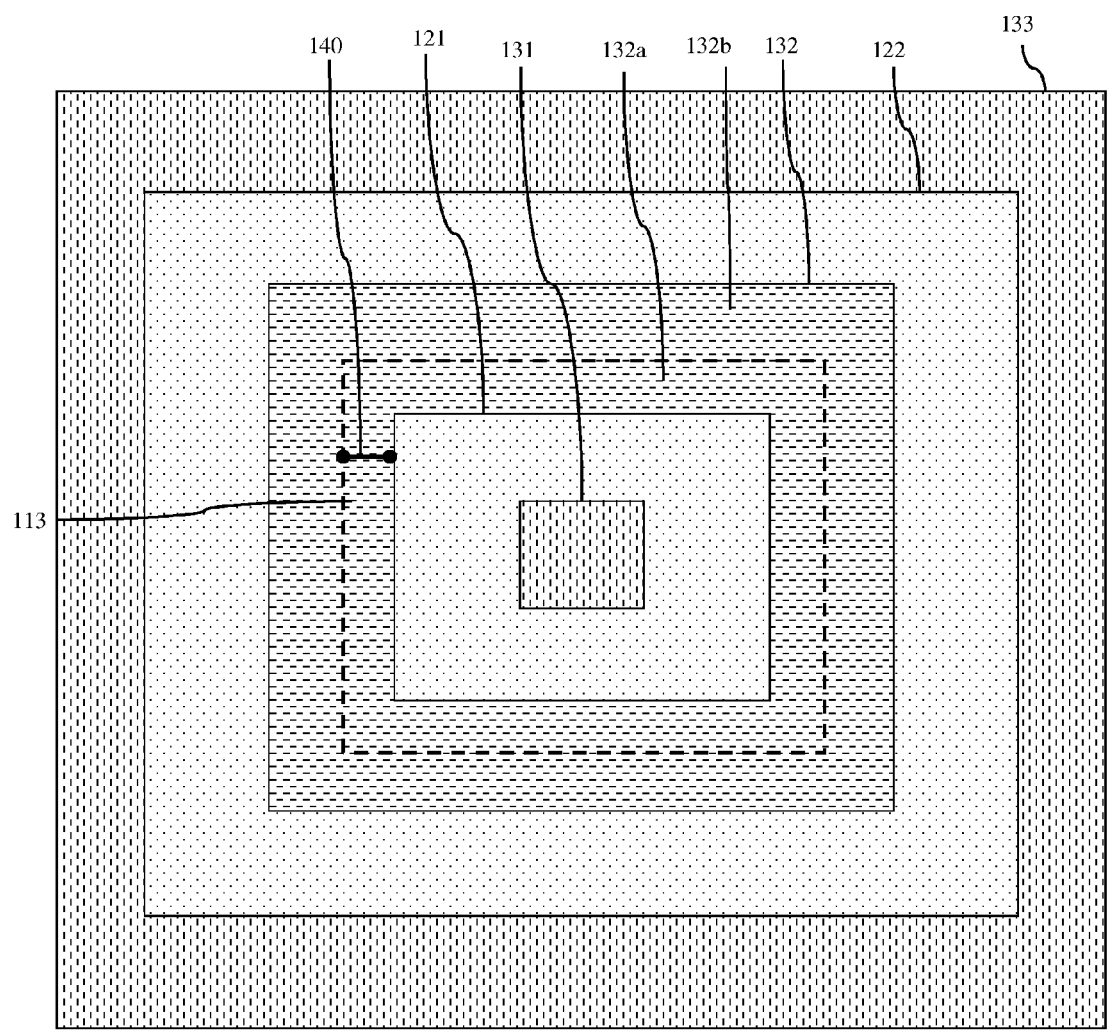
FIG. 2 is a top view diagram of the Zener diode of FIG. 1.

More particularly, FIGS. 1-2 illustrate an embodiment of a Zener diode 100. FIG. 1 is a cross-section illustration of the Zener diode 100 through a vertical plan that cuts across the active regions of the device and FIG. 2 is a cross-section illustration of the same Zener diode 100 through a horizontal plane A-A', as shown in FIG. 1.

Referring to FIGS. 1 and 2 in combination, the Zener diode 100 can comprise a semiconductor layer 103, having a top surface 105. The Zener diode 100 can further comprise a first well region 111 and a second well region 112 in the semiconductor layer 103. The second well region 112 can be positioned laterally adjacent to and can abut the first well region 111 at an interface 113. For example, the second well region 112 can laterally surround (e.g., encircle) the first well region 111. The first well region 111 can have a first type conductivity and the second well region 112 can have a second type conductivity different from the first type conductivity. For example, the first well region 111 can have a P-type conductivity such that it comprises an anode well region and the second well region 112 can have an N-type conductivity such that it comprises a cathode well region.

In one embodiment, this semiconductor layer 103 can be a bulk semiconductor substrate (e.g., a bulk silicon substrate). In this case, a buried well region 102, having the second type conductivity (e.g., a buried N-well region), can isolate the active regions of the diode 100 from a lower portion 101 of the substrate, which has the first type conductivity (e.g., a P− lower substrate). In another embodiment, the semiconductor layer 103 can be a semiconductor layer of a semiconductor-on-insulator (SOI) structure. Such an SOI structure can comprise a semiconductor substrate 101, having the first type conductivity (e.g., a P− silicon substrate), an isolation layer 102 (e.g., a silicon dioxide ($SiO_2$) layer, a sapphire layer or some other suitable isolation layer) on the substrate 101, and a semiconductor layer 103 (e.g., a silicon layer or some other suitable semiconductor layer) on the isolation layer 102.

The Zener diode 100 can further comprise a first contact region 131, a second contact region 132 and, optionally, an additional contact region 133 in the semiconductor layer 103 at the top surface 105. Specifically, the first contact region 131 can comprise a doped region contained entirely within the first well region 111 and can have the first type conductivity at a relatively higher conductivity level than the first well region 111. For example, the first contact region 131 can comprise a P+ anode contact region. The second contact region 132 can comprise another doped region and can have the second type conductivity at a relatively higher conductivity level than the second well region 112. For example, the second contact region 132 can comprise an N+ cathode contact region. However, rather than being contained within the second well region 112, the second contact region 132 can further traverse the interface 113 (i.e., the first well region 111 to second well region 112 interface 113) such that a first end 132a of the second contact region 132 extends laterally into the first well region 111 and a second end 132b of the second contact region 132 extends laterally into the second well region 112.

The additional contact region 133 can comprise an additional doped region contained entirely within the second well region 112 and can have the second type conductivity at a relatively higher conductivity level than the second well region 111. For example, the additional contact region 133 can comprise an additional N+ cathode contact region.

The Zener diode 100 can further comprise isolation regions 121 and 122, which are positioned at the top surface of the semiconductor layer 103 and which define the limits (i.e., the boundaries, shapes, etc.) of the contact regions 131-133. The isolation region 121 can be contained entirely within the first well region 111 and can be positioned laterally between and can abut both the first contact region 131 and the first end 132a of the second contact region 132. Specifically, this isolation region 121 can be positioned laterally around (i.e., can laterally surround, border, etc.) the perimeter (i.e., outer edge) of the first contact region 131 (see FIG. 2). This isolation region 121 can have a first side (i.e., an inner side) adjacent to the first contact region 131 and a second side (i.e., an outer side) opposite the first side adjacent to the first end 132a of the second contact region 132. The additional isolation region 122 can be contained entirely within the second well region 112 and can be positioned laterally between and can abut both the second end 132b of the second contact region 132 and the additional contact region 133. Specifically, this additional isolation region 122 can be positioned laterally around (i.e., can laterally surround, border, etc.) the perimeter (i.e., outer edge) of the second contact region 132 and the additional contact region 133 can be positioned laterally around (i.e., can laterally surround, border, etc.) the additional isolation region 122 (see FIG. 2).

The isolation regions 121 and 122 can comprise, for example, conventional shallow trench isolation (STI) regions. That is, each of the isolation regions 121, 122 can comprise a patterned, relatively shallow, trench extending vertically into the semiconductor layer 103 from the top surface 105. The trench can further be filled with one or more isolation materials (e.g., a silicon oxide, silicon nitride, silicon oxynitride, etc.).

In order to achieve the desired reverse-bias breakdown voltage ($V_b$) (i.e., a predetermined reverse-bias breakdown voltage) given the Zener diode structure described above, the first end 132a of the second contact region 132 (i.e., the portion of the second contact region the extends from the first well region to second well region interface 113 to the isolation region 121) can have a predetermined length 140. Specifically, the length 140 of this end 132a can be selectively adjusted in order to selectively adjust the reverse-bias breakdown voltage ($V_b$) of the Zener diode 100. In particular, increasing the length 140 reduces the reverse-bias breakdown voltage ($V_b$) of the diode 100 and vice versa.

Figure 3:
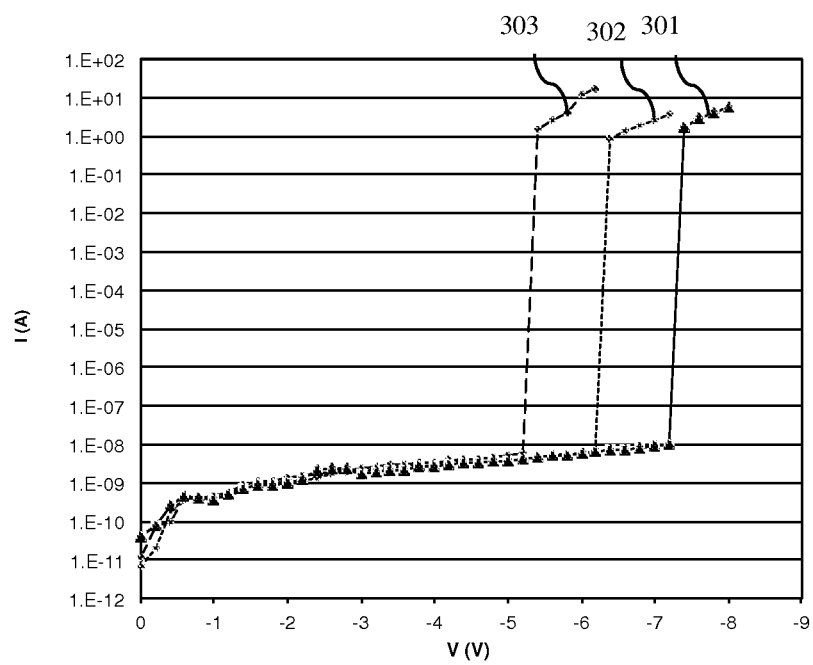
FIG. 3 is a graph illustrating current to voltage (I/V) curves for Zener diodes having selectively different reverse-bias breakdown voltages ($V_b$)

For example, FIG. 3 is a graph that illustrates current to voltage (I/V) curves for three Zener diodes 100 that are essentially identical in structure except that the ends 132a of the second contact regions 132 of each of three Zener diodes have different lengths. I/V curve 301 represents a Zener diode wherein the end 132a is relatively short (e.g., the side of the STI 121 is almost aligned above the interface 113) and, thus, the reverse-bias breakdown voltage ($V_b$) at which a significant amount of current flows through the diode is relative large (e.g., −7V). I/V curve 303 represents a Zener diode wherein the end 132a is relatively long (e.g., 0.5 µm) and, thus, the reverse-bias breakdown voltage ($V_b$) at which a significant amount of current flows through the diode is relatively small (e.g., −5.2V). I/V curve 302 represents a Zener diode wherein the end 132a is somewhere in between (e.g., 0.14 µm) and, thus, the reverse-bias breakdown voltage ($V_b$) at which a significant amount of current flows through the diode is somewhere in between (e.g., −6.2V).

Referring again to FIGS. 1 and 2 in combination, optionally, the Zener diode 100 can further comprise a conductive field plate 150 on the top surface 105 of the semiconductor layer 103 to further ensure that the Zener diode 100 has the desired reverse-bias breakdown voltage ($V_b$). The conductive field plate 150 can have a first sidewall 151 aligned above the isolation region 121 and a second sidewall 152 opposite the first sidewall 151 aligned above the first end 132a of the second contact region 132. That is, the conductive field plate 150 should not extend laterally over the first contact region 131 or the second well region 112. This conductive field plate 150 can comprise, for example, a metal field plate, a metal alloy field plate, a doped polysilicon field plate, etc. Such a conductive field plate 150 is particularly useful to reduce the reverse-bias breakdown voltage ($V_b$) when the sidewall of the isolation region 121 immediately adjacent to the first contact region 131 is not perpendicular (e.g., is rounded as a result of formation processing techniques), a condition which tends to increase the reverse-bias breakdown voltage ($V_b$).

Those skilled in the art will recognize that a Zener diode, such as the diode described above having a scalable reverse-bias breakdown voltage ($V_b$), can be incorporated into an integrated circuit structure for various different purposes, for example, for voltage regulation or for electrostatic discharge (ESD) protection. Furthermore, for illustration purposes, the perimeters (or shapes) of the diode components (e.g., the first contact region 131, STI region 121, the second contact region 132, the STI region 122, etc.) are shown in FIG. 2 as being rectangular. However, those skilled in the art will recognize that these diode components may alternatively have any other suitable shape (e.g., square, circle, oval, etc.).

Figure 4A:
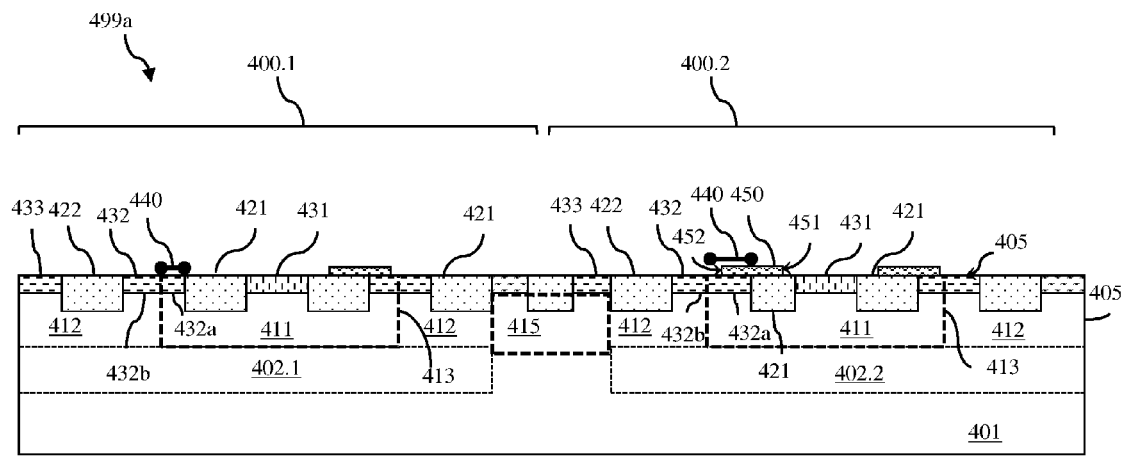
FIG. 4a is a cross-section diagram illustrating an embodiment of a bulk integrated circuit structure incorporating multiple instances of a Zener diode, each instance having a selectively different reverse-bias breakdown voltage ($V_b$)
Figure 4B:
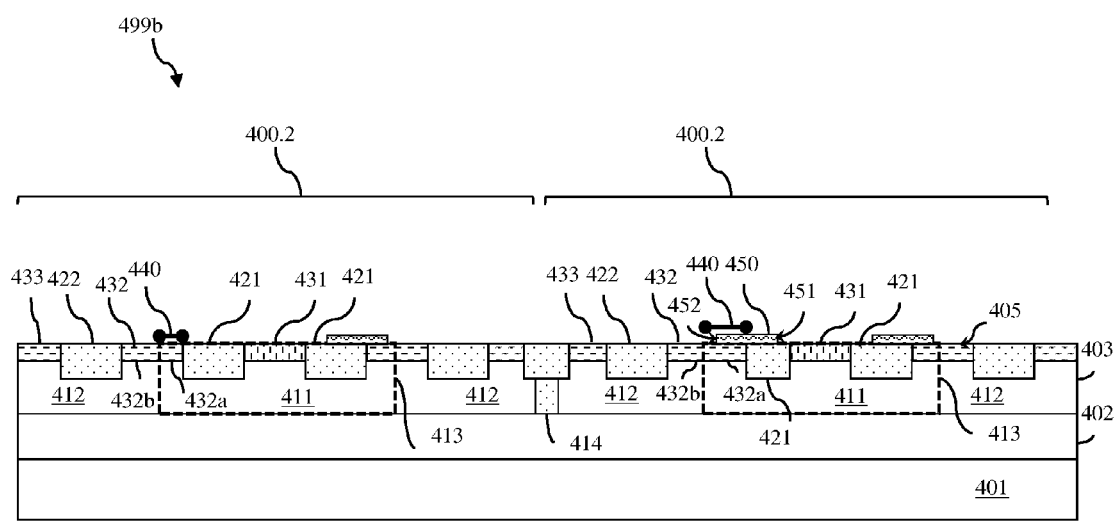
FIG. 4b is a cross section diagram of an embodiment of a semiconductor-on-insulator (SOI) integrated circuit structure incorporating multiple instances of a Zener diode, each instance having a selectively different reverse-bias breakdown voltage ($V_b$)

Referring to FIGS. 4a and 4b, also disclosed herein are embodiments of an integrated circuit structure 499a, 499b incorporating multiple instances of a Zener diode 400.1, 400.2 on the same chip where at least some of the Zener diodes 400.1, 400.2 have different reverse-bias breakdown voltages. The integrated circuit structure 499a, 499b can comprise a semiconductor layer 403, having a top surface 405. As with the Zener diode embodiments described in detail above and illustrated in FIGS. 1-2, this semiconductor layer 403 can comprise either a bulk semiconductor layer, as shown in the integrated circuit structure 499a of FIG. 4a or a semiconductor layer of a semiconductor-on-insulator wafer, as shown in the integrated circuit structure 499b of FIG. 4b.

More specifically, referring to FIG. 4a, in one embodiment of the integrated circuit structure 499a, the semiconductor layer 403 can be a bulk semiconductor substrate (e.g., a bulk silicon substrate). In this case, buried well isolation regions 402.1, 402.2, having the second type conductivity (e.g., buried N-well isolation regions), can isolate the active regions of the Zener diodes 400.1, 400.2, respectively, from a lower portion 401 of the substrate, which has a first type conductivity (e.g., a P− lower substrate). Furthermore, an additional isolation well region 413, having the first type conductivity (e.g., a P-well isolation region), can be positioned laterally between the Zener diodes 400.1, 400.2 to isolate the devices from each other. Referring to FIG. 4b, in another embodiment of the integrated circuit structure 499b, the semiconductor layer 403 can be a semiconductor layer of a semiconductor-on-insulator (SOI) structure. Such an SOI structure can comprise a semiconductor substrate 401, having the first type conductivity (e.g., a P− silicon substrate), an isolation layer 402 (e.g., a silicon dioxide (SiO$_2$) layer, a sapphire layer, or some other suitable isolation layer) on the substrate 401, and a semiconductor layer (e.g., a silicon layer or some other suitable semiconductor layer) on the isolation layer 402. Furthermore, a deep trench isolation region (e.g., a deep trench filled with one or more isolation materials, such a silicon oxide, silicon nitride, silicon oxynitride, etc.) can be positioned laterally between the Zener diodes 400.1, 400.2 and can extend vertically to the isolation layer 402 to isolate the devices from each other.

In any case, each of the Zener diodes 400.1, 400.2 in the integrated circuit structure 499a, 499b of FIGS. 4a and 4b can comprise a first well region 411 and a second well region 412 in the semiconductor layer 403. The second well region 412 can be positioned laterally adjacent to and can abut the first well region 411 at an interface 413. For example, the second well region 412 can laterally surround (e.g., encircle) the first well region 411. The first well region 411 can have a first type conductivity and the second well region 412 can have a second type conductivity different from the first type conductivity. For example, the first well region 411 can have a P-type conductivity such that it comprises an anode well region and the second well region 412 can have an N-type conductivity such that it comprises a cathode well region.

Each of the Zener diodes 400.1, 400.2 can further comprise a first contact region 431, a second contact region 432, and an additional contact region 433 in the semiconductor layer 403 at the top surface 405. Specifically, the first contact region 431 can comprise a doped region contained entirely within the first well region 411 and can have the first type conductivity at a relatively higher conductivity level than the first well region 411. For example, the first contact region 431 can comprise a P+ anode contact region. The second contact region 432 can comprise another doped region and can have the second type conductivity at a relatively higher conductivity level than the second well region 412. For example, the second contact region 432 can comprise an N+ cathode contact region. However, rather than being contained within the second well region 412, the second contact region 432 can further traverse the interface 413 such that a first end 432a of the second contact region 432 extends laterally into the first well region 411 and a second end 432b of the second contact region 432 extends laterally into the second well region 412. The additional contact region 433 can comprise an additional doped region contained entirely within the second well region 412 and can have the second type conductivity at a relatively higher conductivity level than the second well region 412. For example, the additional contact region 433 can comprise an additional N+ cathode contact region.

Each of the Zener diodes 400.1, 400.2 can further comprise isolation regions 421 and 422, which are at the top surface of the semiconductor layer 403 and which define the limits (i.e., the boundaries, shapes, etc.) of the contact regions 431-433. The isolation region 421 can be contained entirely within the first well region 411 and can be positioned laterally between and can abut both the first contact region 431 and the first end 432a of the second contact region 432. Specifically, this isolation region 421 can be positioned laterally around (i.e., can laterally surround, border, etc.) the perimeter (i.e., outer edge) of the first contact region 431. The additional isolation region 422 can be contained entirely within the second well region 412 and can be positioned laterally between and can abut both the second end 432b of the second contact region 432 and the additional contact region 433. Specifically, this additional isolation region 422 can be positioned laterally around (i.e., can laterally surround, border, etc.) the perimeter (i.e., outer edge) of the second contact region 432 and the additional contact region 433 can be positioned laterally around (i.e., can laterally surround, border, etc.) the additional isolation region 422.

The isolation regions 421 and 422 can comprise, for example, conventional shallow trench isolation (STI) regions. That is, each of the isolation regions 421, 422 can comprise a patterned, relatively shallow, trench extending vertically into the semiconductor layer 403 from the top surface 405. The trench can further be filled with one or more isolation materials (e.g., a silicon oxide, silicon nitride, silicon oxynitride, etc.).

In order to achieve the selectively different reverse-bias breakdown voltages (i.e., the different predetermined reverse-bias breakdown voltages) given the Zener diode structures 400.1, 400.2 described above, the first end 432a of the second contact region 432 (i.e., the portion of the second contact region that extends from the interface 413 to the isolation region 421) of the first Zener diode 400.1 can have a different predetermined length 440, than that of the first end 432a of the second contact region 432 of the second Zener diode 400.2. Specifically, the lengths 440 of the ends 432a of the different Zener diodes 400.1 and 400 can be selectively different in order to achieve selectively different reverse-bias breakdown voltages ($V_b$) in the Zener diodes 400.1 and 400.2. In particular, since length 440 of the first end 432a of the second contact region 432 of the first Zener diode 400.1 is greater than that of the second Zener diode 400.2, the first Zener diode 400.1 will have a smaller reverse-bias breakdown voltage ($V_b$). See detail discussion above regarding the graph of FIG. 3 and the relationship between this length and the reverse-bias breakdown voltage ($V_b$).

Referring again to FIGS. 4a and 4b, optionally, at least one of the Zener diodes (e.g., see Zener diode 400.1) can further comprise a conductive field plate 450 on the top surface 405 of the semiconductor layer 403 to further ensure that the Zener diode 400.1 has the desired reverse-bias breakdown voltage ($V_b$). The conductive field plate 450 can have a first sidewall 451 aligned above the isolation region 421 and a second sidewall 452 opposite the first sidewall 451 aligned above the first end 432a of the second contact region 432. That is, the conductive field plate 450 should not extend laterally over the first contact region 431 or the second well region 412. This conductive field plate 450 can comprise, for example, a metal field plate, a metal alloy field plate, a doped polysilicon field plate, etc. Such a conductive field plate 450 is particularly useful in reducing the reverse-bias breakdown voltage ($V_b$) when the sidewall of the isolation region 421 immediately adjacent to the first contact region 431 is not perpendicular (e.g., is rounded), a condition which tends to increase the reverse-bias breakdown voltage ($V_b$).

Those skilled in the art will recognize that Zener diodes, such as Zener diodes 400.1, 400.2 described above, having different reverse-bias breakdown voltages, can be incorporated into the integrated circuit structure 499a, 499b for different purposes (e.g., for voltage regulation and electrostatic discharge (ESD) protection, respectively).

Figure 5:
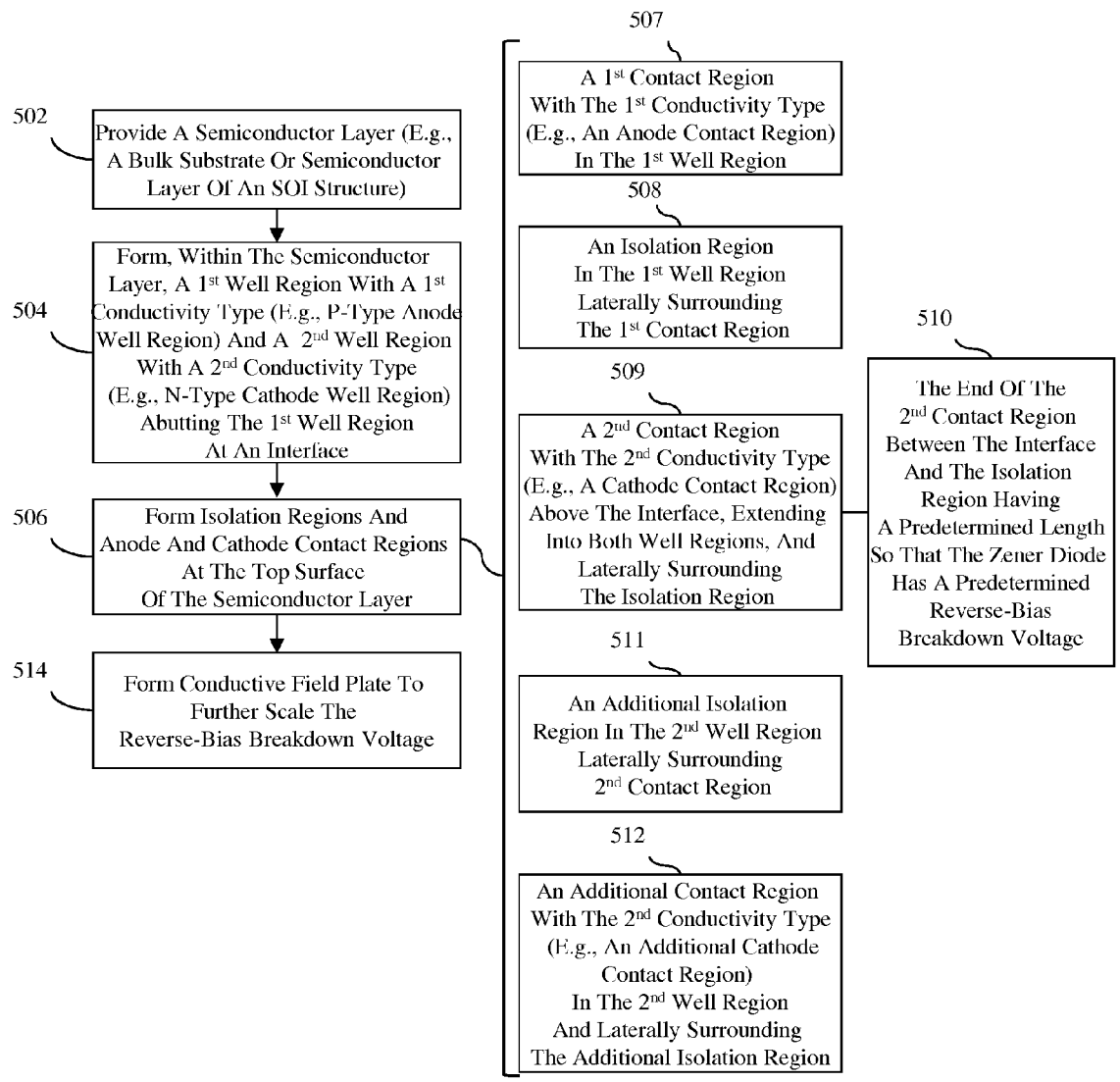
FIG. 5 is a flow diagram illustrating an embodiment of a method of forming a Zener diode.
Figure 6:
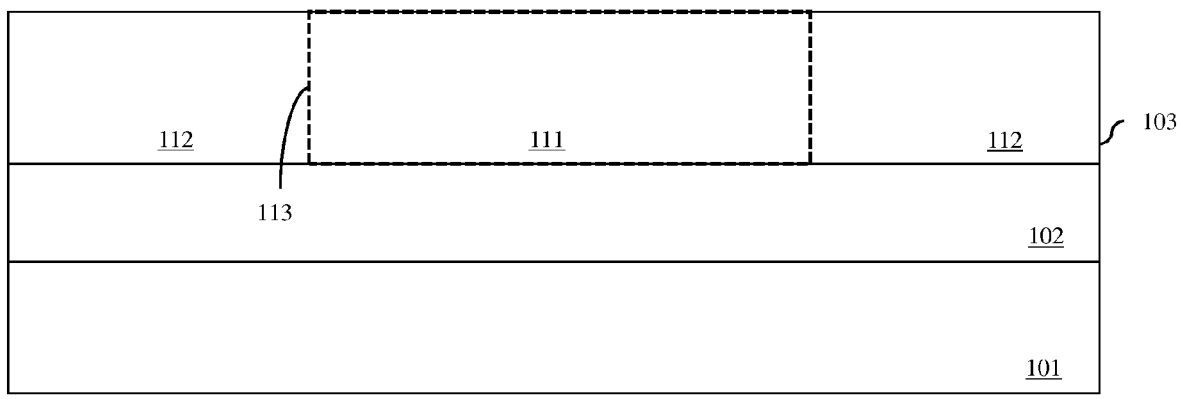
FIG. 6 is a cross-section diagram illustrating a partially completed Zener diode formed according to the method of FIG. 5.
Figure 7:
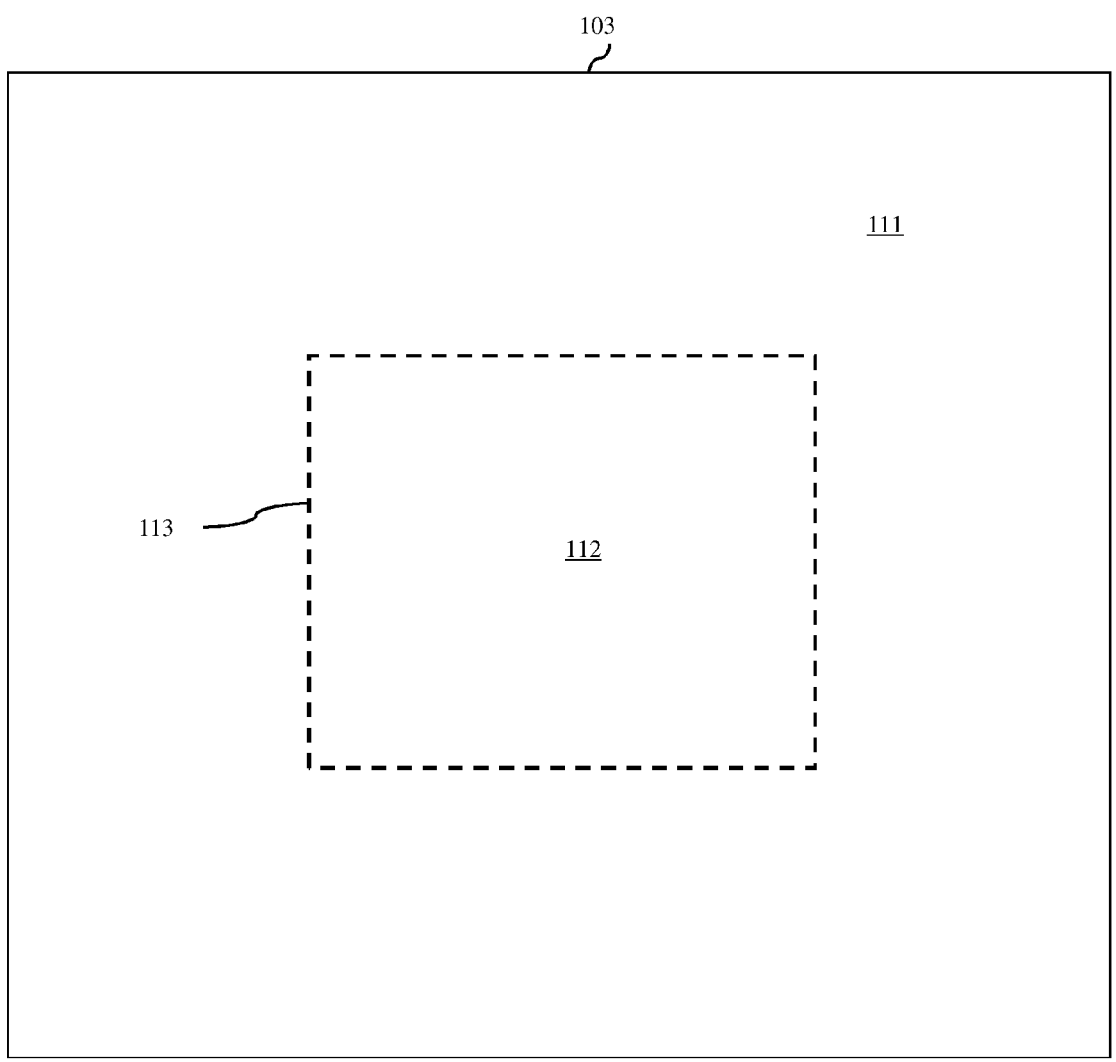
FIG. 7 is a top view diagram of the same partially completed Zener diode as shown in FIG. 6.

Referring to FIG. 5, also disclosed herein are embodiments of a method of forming a Zener diode, such as the Zener diode 100 of FIG. 1 described in detail above. The method embodiments can comprise providing a semiconductor layer 103 (502) and forming adjacent well regions in the semiconductor layer 103 such that the adjacent well regions comprise: a first well region 111 having a first type conductivity (e.g., a P-type anode well region) and a second well region 112 having a second type conductivity different from the first type conductivity (e.g., an N-type cathode well region) positioned laterally adjacent to and, particularly, laterally surrounding and abutting and the first well region at an interface 113 (504, see the cross-section illustration of FIG. 6 and the top view illustration of FIG. 7). Techniques for forming such well regions are well known in the art (e.g., using multiple masked dopant implantation processes) and, thus, are omitted from this specification in order to allow the user to focus on the salient aspects of the invention.

It should be noted that in one embodiment, the semiconductor layer 103 provided at process 502 could be a bulk semiconductor substrate (e.g., a bulk silicon substrate). In this case, prior to the formation of the well regions 111, 112 at process 504, a buried well region 102, having the second type conductivity (e.g., a buried N-well region), can be formed deep in the substrate so as to isolate subsequently formed active regions of the Zener diode from a lower portion 101 of the substrate, which has a the first type conductivity (e.g., a P– lower substrate). In another embodiment, the semiconductor layer 103 provided at process 502 could be a semiconductor layer of a semiconductor-on-insulator (SOI) structure. Such an SOI structure can comprise a semiconductor substrate 101, having the first type conductivity (e.g., a P– silicon substrate), an isolation layer 102 (e.g., a silicon dioxide ($SiO_2$) layer, sapphire layer or some other suitable isolation layer) on the substrate 101, and a semiconductor layer (e.g., a silicon layer or some other suitable semiconductor layer) on the isolation layer 102.

Referring again to FIG. 5, the method embodiments can further comprise forming shallow trench isolation (STI) regions 121-122 and anode and cathode contact regions 131-133 at the top surface 105 of the semiconductor layer 103 (506). Process 506 can specifically be performed so as to form the various contact regions and isolation regions, as shown in FIGS. 1 and 2 and described in detail above.

Specifically, process 506 can be performed so as to form a first contact region 131, which is contained entirely within the first well region 111 and which has the first type conductivity at a relatively higher conductivity level than the first well region 111 (e.g., a P+ anode contact region) (507).

Process 506 can be performed so as to form an isolation region 121 such that the isolation region 121 is contained entirely within the first well region 111 and such that the isolation region 121 is positioned adjacent to (e.g., laterally surrounds, borders, etc.) and abuts the first contact region 131 (508).

Process 506 can further be performed so as to form a second contact region 132 such that the second contact region 132 traverses the interface 113 between the well regions 111-112 (i.e., has a first end 132a extending laterally into the first well region 111 and a second end 132b extending laterally into the second well region 112), such that the second contact region 132 is positioned adjacent to (e.g., laterally surrounds, borders, etc.) and abuts the isolation region 121 and such that the second contact region 132 has a second type conductivity at a relatively higher conductivity level than the second well region 112 (e.g., a N+ cathode region) (509). It should be noted that this second contact region 132 should specifically be formed so that the first end 132a between the interface 113 and the isolation region 121 has a predetermined length 140 and, thereby so that the Zener diode 100 has a predetermined reverse-bias breakdown voltage ($V_b$) (510).

Process 506 can further be performed so as to form an additional isolation region 122 such that the additional isolation region 122 is contained entirely within the second well region 111 and such that the additional isolation region is adjacent to (e.g., laterally surrounds, borders, etc.) and abuts the second contact region 132 (511).

Finally, process 506 can be performed so as to form an additional contact region 133 such that the additional contact region 133 is contained entirely within the second well region 112, such that the additional contact region is positioned adjacent to (e.g., laterally surrounds, borders, etc.) and abuts the additional isolation region 122 and such that the additional contact region 133 has the second type conductivity at a relatively higher conductivity level than the second well region 111 (e.g., an additional N+ cathode contact region) (512).

Figure 8:
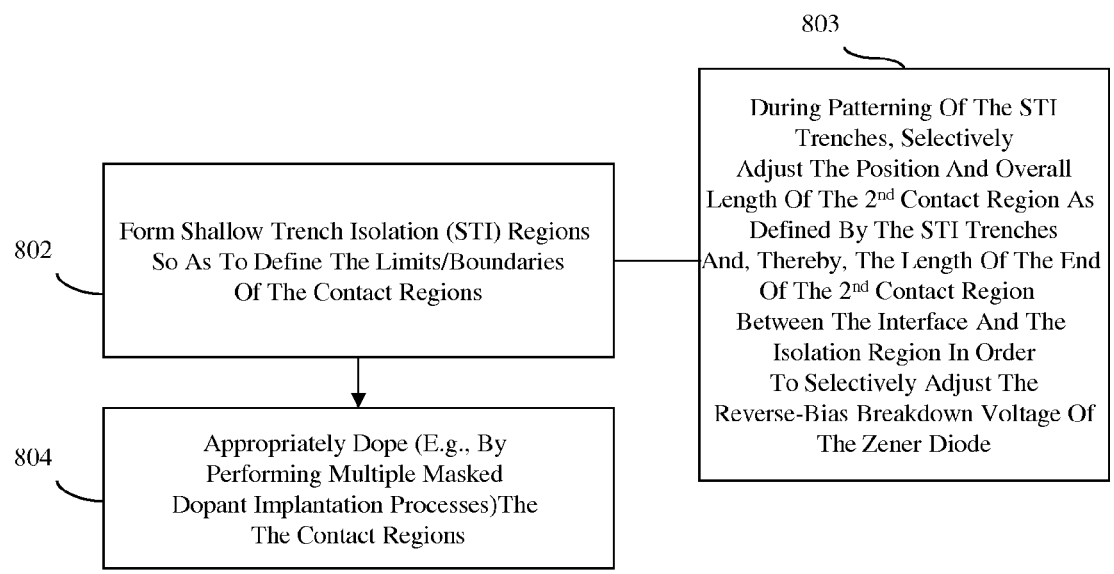
FIG. 8 is a flow diagram further detailing process 506 of the flow diagram of FIG. 5.
Figure 9:
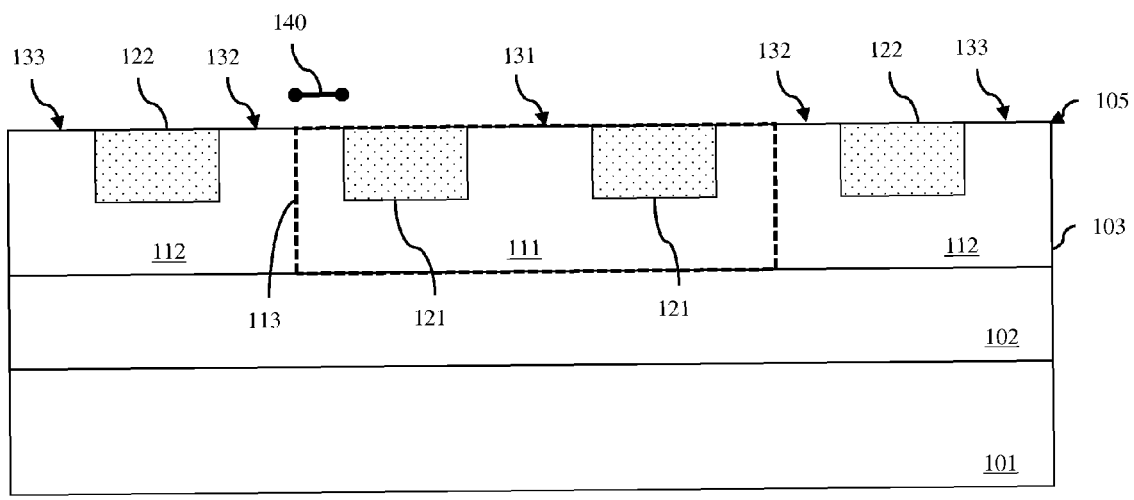
FIG. 9 is a cross-section diagram illustrating a partially completed Zener diode formed according to the method of FIG. 5.
Figure 10:
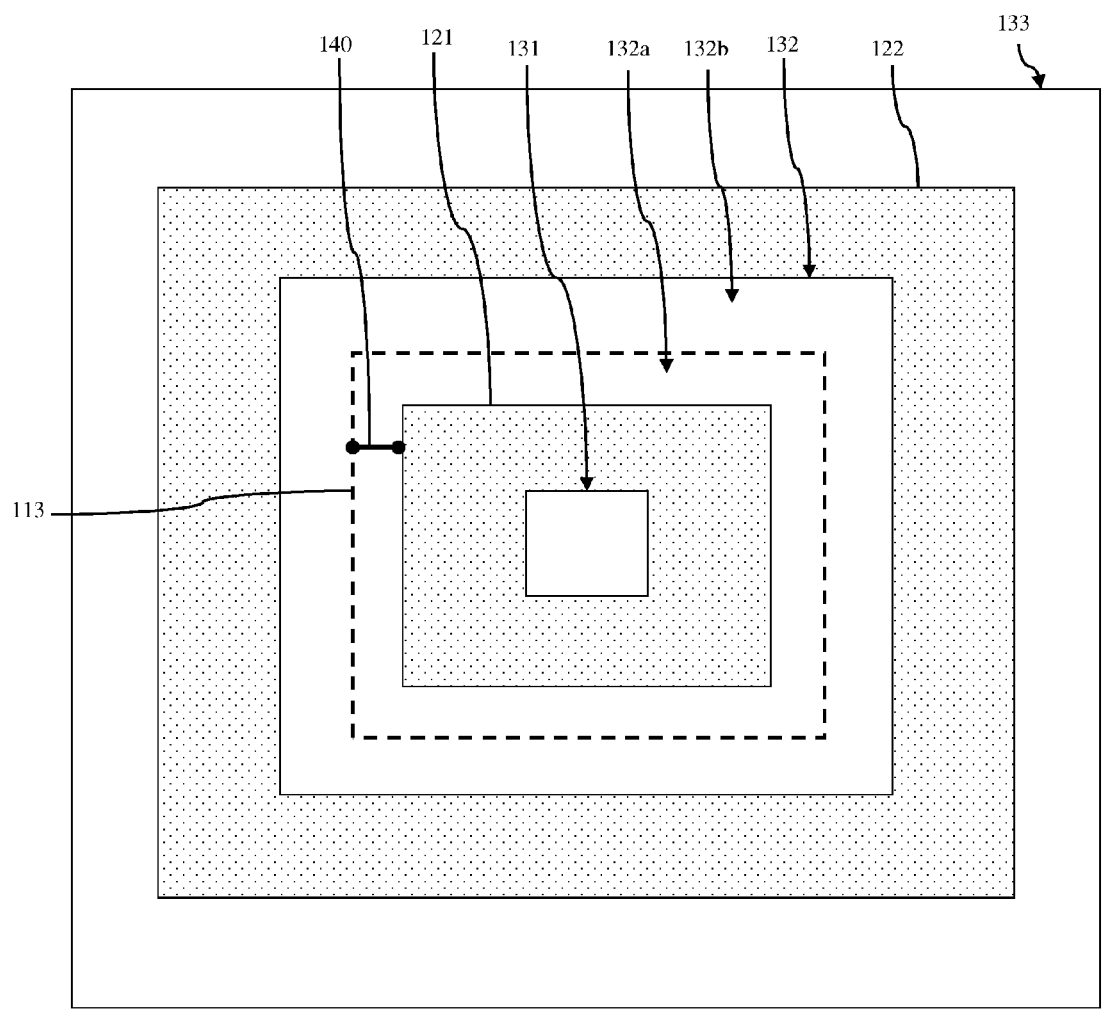
FIG. 10 is a top view diagram of the same partially completed Zener diode as shown in FIG. 9.

More specifically, referring to FIG. 8, this process 506 of forming the isolation regions 121-122 and anode and cathode contact regions 131-133 for the Zener diode 100 can comprise forming shallow trench isolation (STI) regions 121-122 that define the limits (i.e., boundaries, shapes, etc.) of the contact regions 131-133, as described above (802). That is, conventional STI formation techniques can be used to pattern, etch and fill the trenches for each of the STI regions 121-122 and to, thereby define the limits (i.e., boundaries, shapes, etc.) of the contact regions 131-133 (see the cross-section and top view diagrams of FIG. 9 and FIG. 10, respectively). It should be noted that the novelty in this case is not how the STI regions 121 are formed but that the STI trenches are patterned so that the defined area for the second contact region 132 (i.e., the N+ cathode region) in particular, which lies between the trenches, traverses the interface 113 between the well regions 111-112 as opposed to being contained entirely within the well region 112. Furthermore, during the patterning of the STI trenches, the position of the STI trenches relative to the interface 113 is selectively adjusted so as to selectively adjust the position and overall length of the second contact region 132 and, thereby to selectively adjust the length 140 of the end 132a of that second contact region 132 that extends from the interface 113 to the STI region 121. By selectively adjusting the length 140 of the end 132a of the second contact region 132, the reverse-bias breakdown voltage ($V_b$) of the Zener diode 100 can be selectively adjusted (803). See also the detailed discussion above regarding the graph of FIG. 3 illustrating the inverse relationship between the length 140 of the end 132 of the second contact region 132 that extends into the well region 111 and the reverse-bias breakdown voltage ($V_b$) of the Zener diode 100. Once the STI trenches are patterned and etched, they can be filled using conventional STI formation techniques with one or more isolation materials (e.g., a silicon oxide, silicon nitride, silicon oxynitride, etc.).

Figure 11:
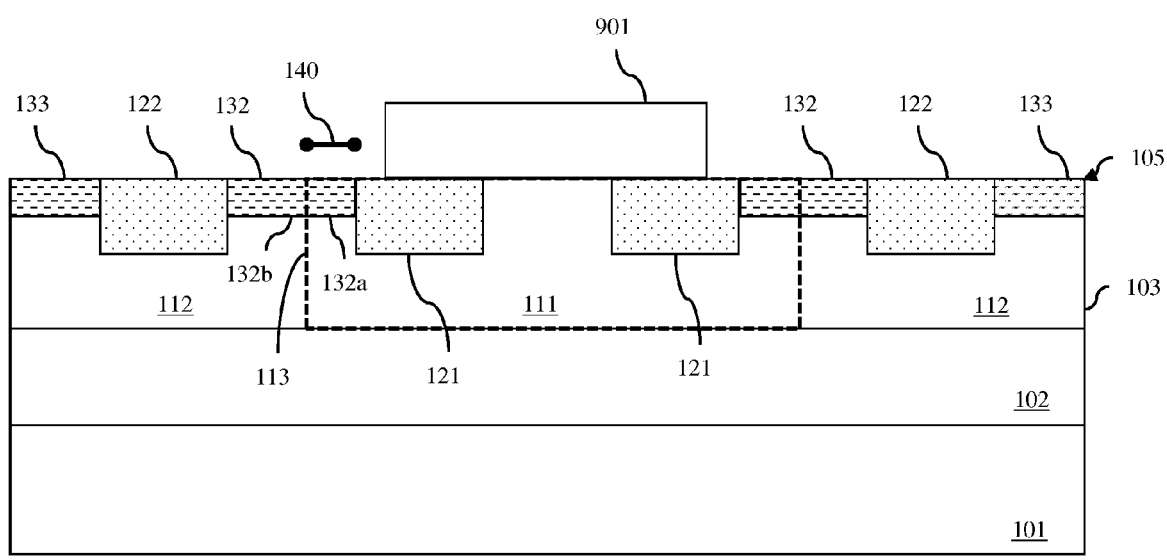
FIG. 11 is a cross-section diagram illustrating a partially completed Zener diode formed according to the method of FIG. 5.
Figure 12:
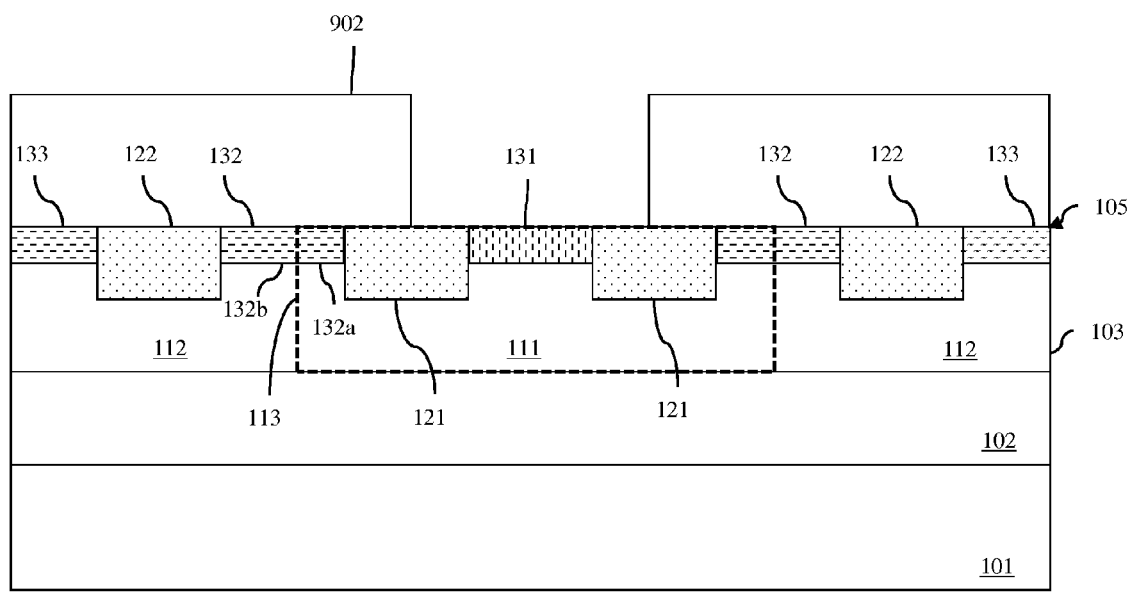
FIG. 12 is a cross-section diagram illustrating a partially completed Zener diode formed according to the method of FIG. 5.

Following STI 121-122 formation at process 802, the contact regions 131-133 can be appropriately doped (804). For example, a mask 901 can be formed so as to cover the exposed portion of the semiconductor layer 103 surrounded by the STI region 121 and a dopant implantation process or other doping process can be performed in order to doped the exposed areas of the top surface 105 of the semiconductor layer 103 adjacent to the STI region 122 and, thereby form contact regions 132 and 133 having the second type conductivity (e.g., N+ cathode regions) (see FIG. 11). Next, the mask 901 can be removed, another mask 902 can be formed so as to cover the exposed portion of the semiconductor layer 103 adjacent to the STI region 122, and another dopant implantation or other doping process can be performed in order to doped the exposed area of the top surface 105 of the semiconductor layer 103 surrounded by the STI region 121 and, thereby form contact region 131 having the first type conductivity (e.g., a P+ anode region) (see FIG. 12).

Those skilled in the art will recognize that the order of the process steps set forth in FIG. 8 are offered for illustration purposes only. Alternatively, areas of the top surface of the semiconductor layer 103 that will contain the contact regions 131-133 can be appropriately doped and, then, the STI regions 121 can be formed to specifically define the limits/boundaries of those regions. Additionally, it should be noted that the disclosed process described above for selectively adjusting the reverse-bias breakdown voltage ($V_b$) is an improvement over prior art techniques because it is achieved by simply selectively adjusting the position of the second contact region 132 and not by requiring additional masking and doping processes (i.e., it is a less costly zero-mask adder process).

Referring again to FIG. 5, optionally, the method embodiments can further comprise forming a conductive field plate 150 (e.g., a doped polysilicon, metal or metal alloy conductive field plate) on the top surface 105 of the semiconductor layer 103 in order to further reduce the reverse-bias breakdown voltage ($V_b$) of the diode and ensure that a desired reverse-bias breakdown voltage ($V_b$) is achieved (514, see FIG. 1). In this case, the conductive field plate 150 should be formed so that a first sidewall 151 is aligned above the isolation region 121 and a second sidewall 152 opposite the first sidewall 151 is aligned above the first end 132a of the second contact region 132 (i.e., so that the conductive field plate 150 does not extend laterally over the first contact 131 or the second well region 112). Such a conductive field plate 150 can be formed essentially simultaneously with the formation of polysilicon and/or metal gate structures on the top surface 105 of the semiconductor layer 103. Thus, it should be noted that this process for further adjusting the reverse-bias breakdown voltage ($V_b$) is also an improvement over prior art techniques because it too is achieved by without requiring additional masking (i.e., it is a less costly zero-mask adder process).

Finally, it should be noted that, although the embodiments of the method are described above with reference to the Zener diode 100 illustrated in FIGS. 1-2, essentially the same method steps may be used to form the Zener diodes 400.1, 400.2 of the integrated circuit embodiments 499a, 499b illustrated in FIGS. 4a and 4b, respectively, and described in detail above. Those skilled in the art will, however, recognize that depending upon the whether a bulk semiconductor wafer or semiconductor-on-insulator wafer is used different conventional process steps can be performed to provide isolation between the device-to-substrate isolation and device-to-device isolation. For example, in the case of the integrated circuit structure 499a of FIG. 4a, which is formed on a bulk semiconductor wafer, discrete buried well isolation regions 402.1, 402.2, having the second type conductivity (e.g., buried N-well isolation regions), can be formed (e.g., implanted) prior to device formation to isolate the active regions of the subsequently formed diodes 400.1, 400.2, respectively, from a lower portion 401 of the first type conductivity substrate (e.g., P− substrate). Furthermore, an additional isolation well region 415, having the first type conductivity (e.g., a P-well isolation region), can be formed (e.g., implanted) such that it is positioned laterally between the Zener diodes 400.1, 400.2 to isolate the devices from each other. Alternatively, in the case of the integrated circuit structure 499b of FIG. 4b, wherein the Zener diodes 400.1, 400.2 are formed in a semiconductor layer 403 of a semiconductor-on-insulator (SOI) wafer, the SOI isolation layer 402 (e.g., a silicon dioxide ($SiO_2$) layer, sapphire layer or some other suitable isolation layer) can provide the device to substrate isolation. Furthermore, a deep trench isolation region (e.g., a deep trench filled with one or more isolation materials, such a silicon oxide, silicon nitride, silicon oxynitride, etc.) can be formed (e.g., using conventional deep trench isolation processing techniques) such it will be positioned laterally between the Zener diodes 400.1, 400.2 and extends vertically to the isolation layer 403 to isolate the devices from each other.

Also disclosed herein are embodiments of design structures for the above-mentioned Zener diode and integrated circuit. Such design structures can be stored on a non-transitory storage medium readable by a computer and can comprise data and instructions that when executed by the computer can generate a machine-executable representation of the diode or integrated circuit.

Figure 13:
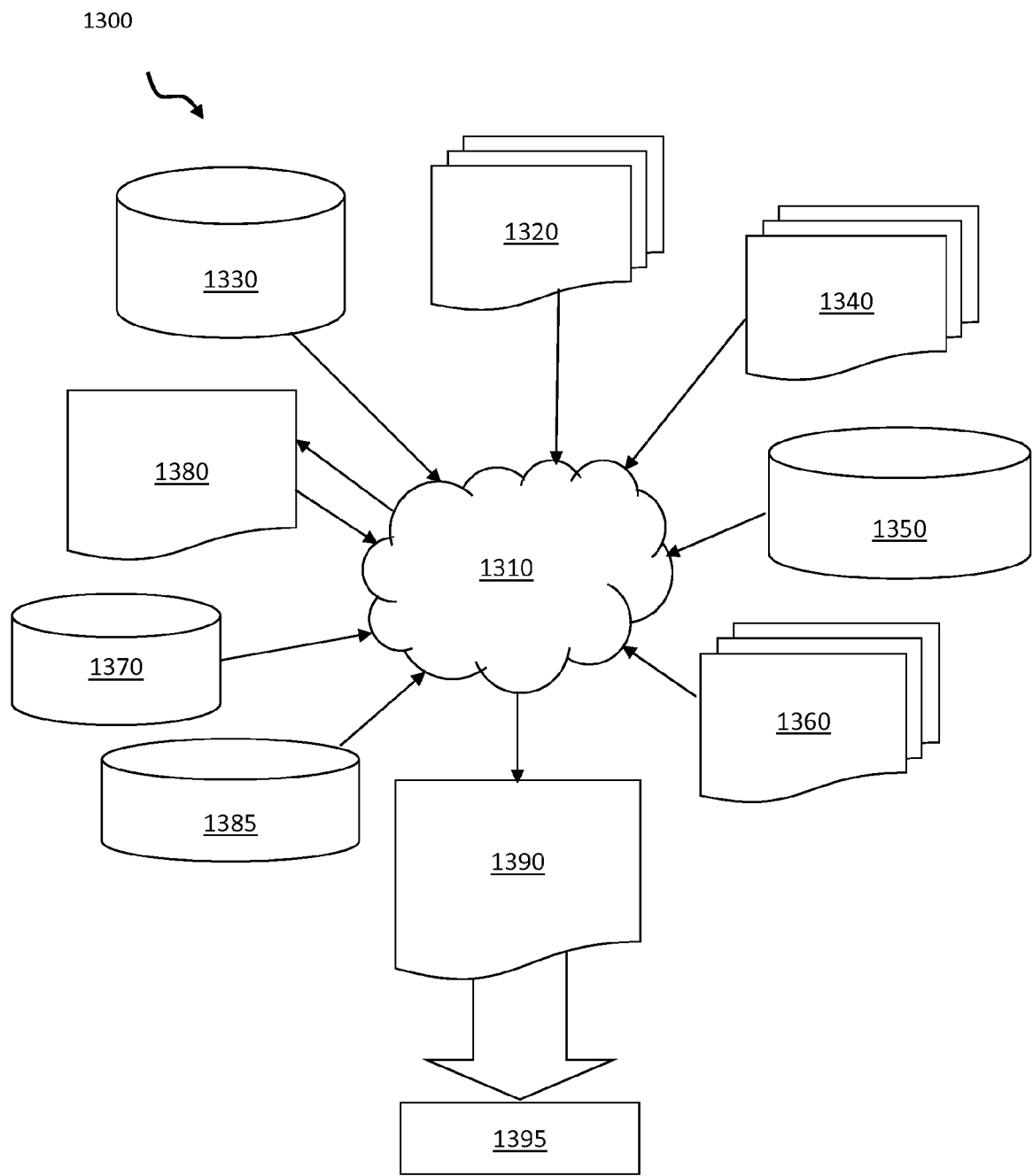
FIG. 13 is a flow diagram of a design process used in semiconductor design, manufacture and/or test.

Specifically, FIG. 13 shows a block diagram of an exemplary design flow 1300 used for example, in semiconductor design, manufacturing, and/or test. Design flow 1300 may vary depending on the type of IC being designed. For example, a design flow 1300 for building an application specific IC (ASIC) may differ from a design flow 1300 for designing a standard component. Design structure 1320 is preferably an input (e.g., of data and instructions) to a design process 1310 and may come from an IP provider, a core developer, or other design company or may be generated by the operator of the design flow, or from other sources. Design structure 1320 comprises an embodiment of a Zener diode 100 as shown in FIGS. 1-2 or an integrated circuit with multiple instances of Zener diode 400.1, 400.2, as shown in FIGS. 4a and 4b, in the form of schematics or HDL, a hardware-description language (e.g., Verilog, VHDL, C, etc.). Design structure 1320 may be contained on (i.e., stored on) one or more machine-readable medium. For example, design structure 1320 may be a text file or a graphical representation of an embodiment of a Zener diode 100 as shown in FIGS. 1-2 or an integrated circuit with multiple instances of Zener diode 400.1, 400.2, as shown in FIGS. 4a and 4b.

Design process 1310 preferably executes the data and instructions in order to synthesize (or translate) an embodiment of a Zener diode 100 as shown in FIGS. 1-2 or an integrated circuit with multiple instances of Zener diode 400.1, 400.2, as shown in FIGS. 4a and 4b, into a netlist 1380, where netlist 1380 is, for example, a list of wires, transistors, logic gates, control circuits, I/O, models, etc. that describes the connections to other elements and circuits in an integrated circuit design and recorded on at least one of machine readable medium. This may be an iterative process in which netlist 1380 is resynthesized one or more times depending on design specifications and parameters for the circuit.

Design process 1310 may include using a variety of inputs; for example, inputs from library elements 1330 which may house a set of commonly used elements, circuits, and devices, including models, layouts, and symbolic representations, for a given manufacturing technology (e.g., different technology nodes, 32 nm, 45 nm, 90 nm, etc.), design specifications 1340, characterization data 1350, verification data 1360, design rules 1370, test data files 1385 (which may include test patterns and other testing information), and instructions.

Design process 1310 may further include, for example, standard circuit design processes such as timing analysis, verification, design rule checking, place and route operations, etc. One of ordinary skill in the art of integrated circuit design can appreciate the extent of possible electronic design automation tools and applications used in design process X10 without deviating from the scope and spirit of the embodiments herein. The design structures of the embodiments are not limited to any specific design flow.

Design process 1310 preferably translates an embodiment of a Zener diode 100 as shown in FIGS. 1-2 or an integrated circuit with multiple instances of Zener diode 400.1, 400.2, as shown in FIGS. 4a and 4b, along with any additional integrated circuit design or data (if applicable), into a second design structure 1390. Design structure 1390 resides on a storage medium in a data format used for the exchange of layout data of integrated circuits (e.g. information stored in a GDSII (GDS2), GL1, OASIS, or any other suitable format for storing such design structures). Design structure 1390 may comprise information such as, for example, test data files, design content files, manufacturing data, layout parameters, wires, levels of metal, vias, shapes, data for routing through the manufacturing line, and any other data required by a semiconductor manufacturer to produce an embodiment of a Zener diode 100 as shown in FIGS. 1-2 or an integrated circuit with multiple instances of Zener diode 400.1, 400.2, as shown in FIGS. 4a and 4b. Design structure 1390 may then proceed to a stage 1395 where, for example, design structure 1390: proceeds to tape-out, is released to manufacturing, is released to a mask house, is sent to another design house, is sent back to the customer, etc.

Figure 14:
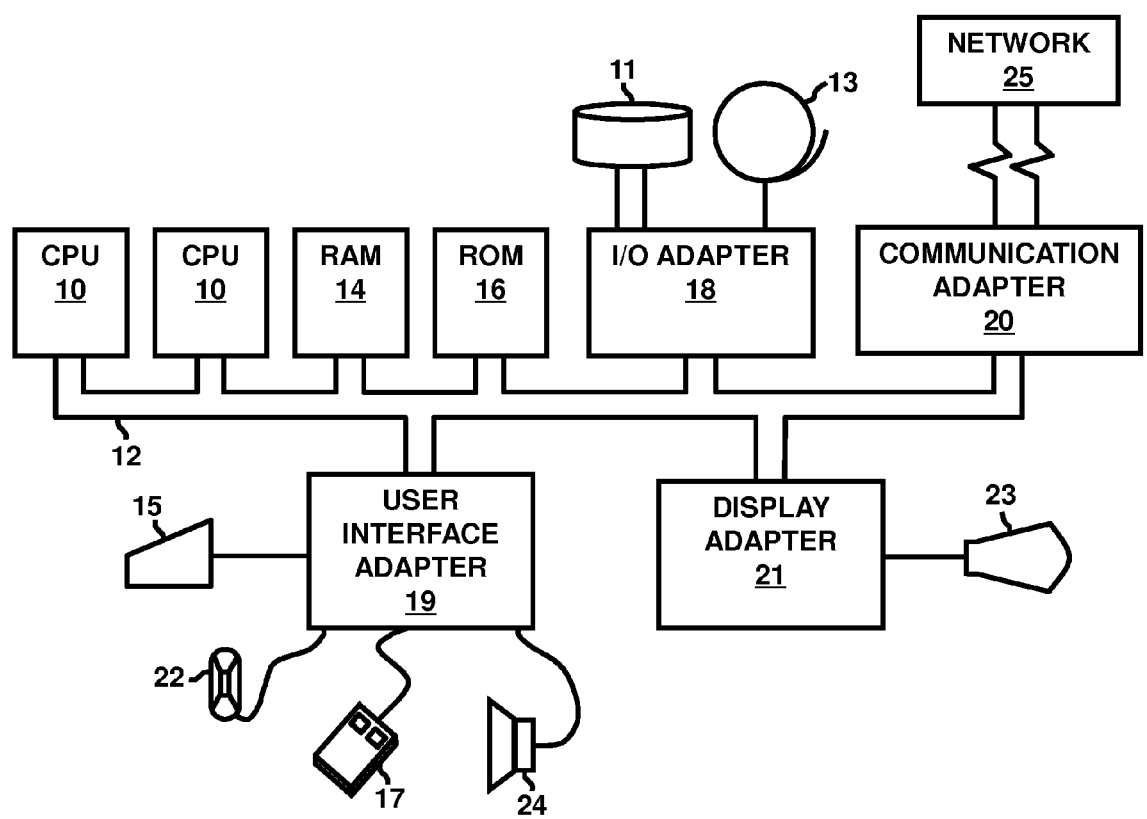
FIG. 14 is a schematic diagram illustrating an exemplary hardware environment for implementing the disclosed design process.

A representative hardware environment for implementing the design flow process, described above and illustrated in FIG. 13, is depicted in FIG. 14. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing particular embodiments only and is not intended to be limiting of those embodiments. As used herein, the singular forms "a", "an" and "the" are intended to include the plural forms as well, unless the context clearly indicates otherwise. It will be further understood that the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. Additionally, it should be understood that terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

It should be further understood that for purposes of this disclosure, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc. Furthermore, an "insulator" is a relative term that means a material or structure that allows substantially less (<95%) electrical current to flow than does a "conductor." The dielectrics (insulators) mentioned herein can oxide-based dielectrics, such oxide-based dielectrics can be grown, for example, from either a dry oxygen ambient or steam and then patterned. Alternatively, the dielectrics herein may be formed from any of the many candidate dielectric materials, including but not limited to silicon nitride, silicon oxynitride, or a metal oxide (e.g., tantalum oxide). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Finally, it should be understood that the corresponding structures, materials, acts, and equivalents of all means or step plus function elements in the claims below are intended to include any structure, material, or act for performing the function in combination with other claimed elements as specifically claimed. The description of the embodiments contained in the specification have been presented for purposes of illustration and description, but is not intended to be exhaustive or limited to the embodiments in the form disclosed. Many modifications and variations will be apparent to those of ordinary skill in the art without departing from the scope and spirit of the embodiments.

Therefore, disclosed above are embodiments of an isolated Zener diode structure having a scalable reverse-bias breakdown voltage ($V_b$) as a function of the position of a cathode contact region relative to the interface between adjacent cathode and anode well regions. Specifically, cathode and anode contact regions are positioned adjacent to corresponding cathode and anode well regions and are further separated by an isolation region. While the anode contact region is contained entirely within the anode well region, one end of the cathode contact region can extend laterally into the anode well region. The length of this end (i.e., the length of the portion of the cathode contact region between the interface and the isolation region) can be selectively adjusted in order to selectively adjust the reverse-bias breakdown voltage ($V_b$) of the diode. Specifically, increasing the length reduces the reverse-bias breakdown voltage ($V_b$) of the diode and vice versa. Also disclosed herein are embodiments of an integrated circuit incorporating multiple instances of the Zener diode, having different reverse-bias breakdown voltages, of a method of forming the Zener diode and of a design structure for the Zener diode. In other words, these embodiments allow scaling of the reverse-bias breakdown voltage ($V_b$) of a Zener diode to be achieved by simply selectively adjusting the position of the cathode contact region and, optionally, adding a conductive field plate. These technique can be incorporated into conventional device processing (e.g., well implantation, STI formation, and gate formation) without requiring additional masking and doping processes (i.e., it is a zero-mask adder technique).

What is claimed is:

1. A diode comprising:
a first well region, having a first type conductivity, in a semiconductor layer;
a second well region, having a second type conductivity different from said first type conductivity, in said semiconductor layer and positioned laterally adjacent to and abutting said first well region at an interface;
a first contact region, having said first type conductivity, at a top surface of said semiconductor layer within said first well region;
a second contact region, having said second type conductivity, at said top surface of said semiconductor layer traversing said interface such that a first end of said second contact region extends laterally into said first well region and a second end of said second contact region extends laterally into said second well region;
an isolation region at said top surface of said semiconductor layer within said first well region, and positioned laterally between said first contact region and said first end of said second contact region; and
a conductive field plate on said isolation region within said first well region and extending laterally onto said first end of said second contact region within said first well region such that said conductive field plate has a first sidewall aligned above said isolation region and a second sidewall opposite said first sidewall, aligned above said first end of said second contact region within said first well region and offset from said interface so that said conductive field plate covers less than all of said first end of said second contact region within said first well region.

2. The diode of claim 1, said first end having a predetermined length from said interface to said isolation region and said conductive field plate covering less than all of said first end so that said diode is structured to have a predetermined reverse-bias breakdown voltage.

3. The diode of claim 1, said conductive field plate comprising any one of a metal field plate and a doped polysilicon field plate.

4. The diode of claim 1, further comprising:
an additional contact region, having said second type conductivity, at said top surface of said semiconductor layer within said second well region; and
an additional isolation region positioned laterally between and abutting said additional contact region and said second end of said second contact region.

5. The diode of claim 1,
said second well region laterally surrounding said first well region,
said isolation region laterally surrounding said first contact region, and
said second contact region laterally surrounding said isolation region.

6. The diode of claim 1,
said first type conductivity comprising P-type conductivity, and
said second type conductivity comprising N-type conductivity.

7. The diode of claim 1, said semiconductor layer comprising a bulk semiconductor substrate further comprising a buried well region having said second type conductivity below said first well region and said second well region.

8. The diode of claim 1, further comprising an isolation layer below said semiconductor layer.

9. A diode comprising:
a first well region, having a first type conductivity, in a semiconductor layer;
a second well region, having a second type conductivity different from said first type conductivity, in said semiconductor layer and positioned laterally adjacent to and abutting said first well region at an interface;
a first contact region, having said first type conductivity, at a top surface of said semiconductor layer within said first well region;
a second contact region, having said second type conductivity, at said top surface of said semiconductor layer traversing said interface such that a first end of said second contact region extends laterally into said first well region and a second end of said second contact region extends laterally into said second well region;
an isolation region at said top surface of said semiconductor layer within said first well region, and positioned laterally between said first contact region and said first end of said second contact region; and
a metal field plate on said isolation region within said first well region and extending laterally onto said first end of said second contact region within said first well region such that said metal field plate has a first sidewall aligned above said isolation region and a second sidewall opposite said first sidewall, aligned above said first end of said second contact region within said first well region and offset from said interface so that said metal field plate covers less than all said first end of said second contact region within said first well region.

10. The diode of claim 9, said first end having a predetermined length from said interface to said isolation region and said metal field plate covering less than all of said first end so that said diode is structured to have a predetermined reverse-bias breakdown voltage.

11. The diode of claim 9, further comprising:
an additional contact region, having said second type conductivity, at said top surface of said semiconductor layer within said second well region; and
an additional isolation region positioned laterally between and abutting said additional contact region and said second end of said second contact region.

12. The diode of claim 9,
said second well region laterally surrounding said first well region,
said isolation region laterally surrounding said first contact region, and
said second contact region laterally surrounding said isolation region.

13. The diode of claim 9,
said first type conductivity comprising P-type conductivity, and
said second type conductivity comprising N-type conductivity.

14. The diode of claim 9, said semiconductor layer comprising a bulk semiconductor substrate further comprising a buried well region having said second type conductivity below said first well region and said second well region.

15. The diode of claim 9, further comprising an isolation layer below said semiconductor layer.

16. The diode of claim 9,
said first type conductivity comprising P-type conductivity, and
said second type conductivity comprising N-type conductivity.

17. A diode comprising:
- a first well region, having a first type conductivity, in a semiconductor layer;
- a second well region, having a second type conductivity different from said first type conductivity, in said semiconductor layer and positioned laterally adjacent to and abutting said first well region at an interface;
- a first contact region, having said first type conductivity, at a top surface of said semiconductor layer within said first well region;
- a second contact region, having said second type conductivity, at said top surface of said semiconductor layer traversing said interface such that a first end of said second contact region extends laterally into said first well region and a second end of said second contact region extends laterally into said second well region;
- an isolation region at said top surface of said semiconductor layer within said first well region, and positioned laterally between said first contact region and said first end of said second contact region; and
- a doped polysilicon field plate on said isolation region within said first well region and extending laterally onto said first end of said second contact region within said first well region such that said doped polysilicon field plate has a first sidewall aligned above said isolation region and a second sidewall opposite said first sidewall, aligned above said first end of said second contact region within said first well region and offset from said interface so that said doped polysilicon field plate covers less than all of said first end of said second contact region within said first well region.

18. The diode of claim 17, said first end having a predetermined length from said interface to said isolation region and said doped polysilicon field plate covering less than all of said first end so that said diode is structured to have a predetermined reverse-bias breakdown voltage.

19. The diode of claim 17, further comprising:
- an additional contact region, having said second type conductivity, at said top surface of said semiconductor layer within said second well region; and
- an additional isolation region positioned laterally between and abutting said additional contact region and said second end of said second contact region.

20. The diode of claim 17,
- said second well region laterally surrounding said first well region,
- said isolation region laterally surrounding said first contact region, and
- said second contact region laterally surrounding said isolation region.

21. The diode of claim 17, said semiconductor layer comprising a bulk semiconductor substrate further comprising a buried well region having said second type conductivity below said first well region and said second well region.

22. The diode of claim 17, further comprising an isolation layer below said semiconductor layer.

23. A diode comprising:
- a first well region, having a first type conductivity, in a semiconductor layer;
- a second well region, having a second type conductivity different from said first type conductivity, in said semiconductor layer, said second well region laterally surrounding and abutting said first well region at an interface;
- a first contact region, having said first type conductivity, at a top surface of said semiconductor layer at a center of said first well region;
- a second contact region, having said second type conductivity, at said top surface of said semiconductor layer traversing said interface such that said second contact region is annular with respect to said first well region and such a first end of said second contact region extends laterally into said first well region and a second end of said second contact region extends laterally into said second well region;
- an isolation region at said top surface of said semiconductor layer within said first well region, laterally surrounding said first contact region and abutting said first end of said second contact region; and
- a conductive field plate on said isolation region within said first well region and extending laterally onto said first end of said second contact region within said first well region such that said conductive field plate has a first sidewall aligned above said isolation region and a second sidewall opposite said first sidewall, aligned above said first end of said second contact region within said first well region and offset from said interface so that said conductive field plate covers less than all of said first end of said second contact region within said first well region.

* * * * *